United States Patent
Ou-Yang

(10) Patent No.: US 8,552,807 B2
(45) Date of Patent: Oct. 8, 2013

(54) ELECTRONIC APPARATUS COMPENSATED THROUGH MONITORING A STATUS OF GNSS RECEIVER AND RELATED METHOD THEREOF

(75) Inventor: Cheng-Yi Ou-Yang, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 313 days.

(21) Appl. No.: 12/905,105

(22) Filed: Oct. 15, 2010

(65) Prior Publication Data
US 2011/0025427 A1    Feb. 3, 2011

Related U.S. Application Data

(63) Continuation of application No. 12/136,751, filed on Jun. 10, 2008, now abandoned.

(51) Int. Cl.
*H03L 1/00* (2006.01)
*G01S 19/38* (2010.01)

(52) U.S. Cl.
USPC ........ 331/175; 331/18; 331/158; 342/357.21; 342/357.51

(58) Field of Classification Search
USPC ........ 331/175, 158, 18, 1 R; 342/352, 357.2, 342/357.21, 357.51
See application file for complete search history.

(56) References Cited

U.S. PATENT DOCUMENTS

| | | | |
|---|---|---|---|
| 4,949,055 A * | 8/1990 | Leitl | 331/158 |
| 5,705,957 A * | 1/1998 | Oka et al. | 331/66 |
| 7,023,286 B2 | 4/2006 | Norman | |
| 7,098,748 B2 * | 8/2006 | Schmidt | 331/176 |
| 7,310,064 B2 | 12/2007 | Cobb | |
| 2001/0017574 A1 * | 8/2001 | Oka | 331/116 R |
| 2005/0285781 A1 * | 12/2005 | Park et al. | 342/357.02 |

* cited by examiner

*Primary Examiner* — Ryan Johnson
(74) *Attorney, Agent, or Firm* — Winston Hsu; Scott Margo

(57) ABSTRACT

In one exemplary implementation, an electronic apparatus includes: a reference clock source, for generating a reference clock; a global navigation satellite system (GNSS) receiver for receiving satellites signals and the reference clock, comprising: a monitoring circuit, for monitoring a status of the GNSS receiver to generate a monitoring result; and a compensating circuit, coupled to the reference clock source and the monitoring circuit, for compensating the reference clock according to the monitoring result.

8 Claims, 11 Drawing Sheets

ELECTRONIC APPARATUS COMPENSATED THROUGH MONITORING A STATUS OF GNSS RECEIVER AND RELATED METHOD THEREOF

RELATED APPLICATIONS

This application is a continuation of U.S. application Ser. No. 12/136,751, filed on Jun. 10, 2008, the contents of which are incorporated herein by reference.

BACKGROUND

The present invention relates to a compensation scheme applied to an electronic apparatus, and more particularly, to an electronic apparatus compensated through monitoring at least a non-temperature factor indicative of frequency drift occurrence of a reference clock and related method thereof.

In general, a reference clock is required for an electronic apparatus to operate normally. Taking the receiver design of a global navigation satellite system (GNSS), such as a global positioning system (GPS), as an example, the GPS receiver includes a GPS IC for processing radio-frequency signals (i.e., satellite signals) and base-band signals for computing the position information and an oscillator acting as a reference clock source with high frequency accuracy. As the positioning performance of the GPS receiver greatly depends on the frequency accuracy of the oscillator, it is desired to make the oscillating signal generated from the oscillator as stable as possible. A temperature compensated crystal oscillator (TCXO) is commonly implemented as the needed reference clock source because a compensation loop is implemented to sense ambient temperature variation by using a temperature sensor and then compensate the oscillating frequency according to the temperature related data given by the temperature sensor. However, in addition to the ambient temperature variation, the oscillator is also influenced by other factors, such as acceleration, unstable power supply, unstable load, and/or change of the operating state. That is, the oscillating signal generated by the temperature compensated crystal oscillator has a frequency drift when one of the non-temperature factors is present. Consequently, the performance of the GPS receiver is degraded as the conventional temperature compensation loop fails to cope with the frequency drift caused by any of the non-temperature factors mentioned above. Herein, the frequency drift includes continuous variation and abrupt jump of frequency.

SUMMARY

According to a first aspect of the present invention, an electronic apparatus is provided. The electronic apparatus includes: a reference clock source, for generating a reference clock; a global navigation satellite system (GNSS) receiver for receiving satellites signals and the reference clock, comprising: a monitoring circuit, for monitoring a status of the GNSS receiver to generate a monitoring result; and a compensating circuit, coupled to the reference clock source and the monitoring circuit, for compensating the reference clock according to the monitoring result.

According to a second aspect of the present invention, an electronic apparatus is provided. The electronic apparatus includes: a reference clock source, for generating a reference clock; a global navigation satellite system (GNSS) receiver for receiving satellites signals and the reference clock, comprising: a processing logic, coupled to the reference clock source, for performing a designated operation according to the reference clock; a monitoring circuit, for monitoring a status of the GNSS receiver to generate a monitoring result; and a compensating circuit, coupled to the processing logic and the monitoring circuit, for compensating the designated operation according to the monitoring result.

According to a third aspect of the present invention, a method of compensating an electronic apparatus is provided. The electronic apparatus comprising a global navigation satellite system (GNSS) receiver. The method includes: monitoring a status of the GNSS receiver to generate a monitoring result; and compensating the reference clock or the designated operation according to the monitoring result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
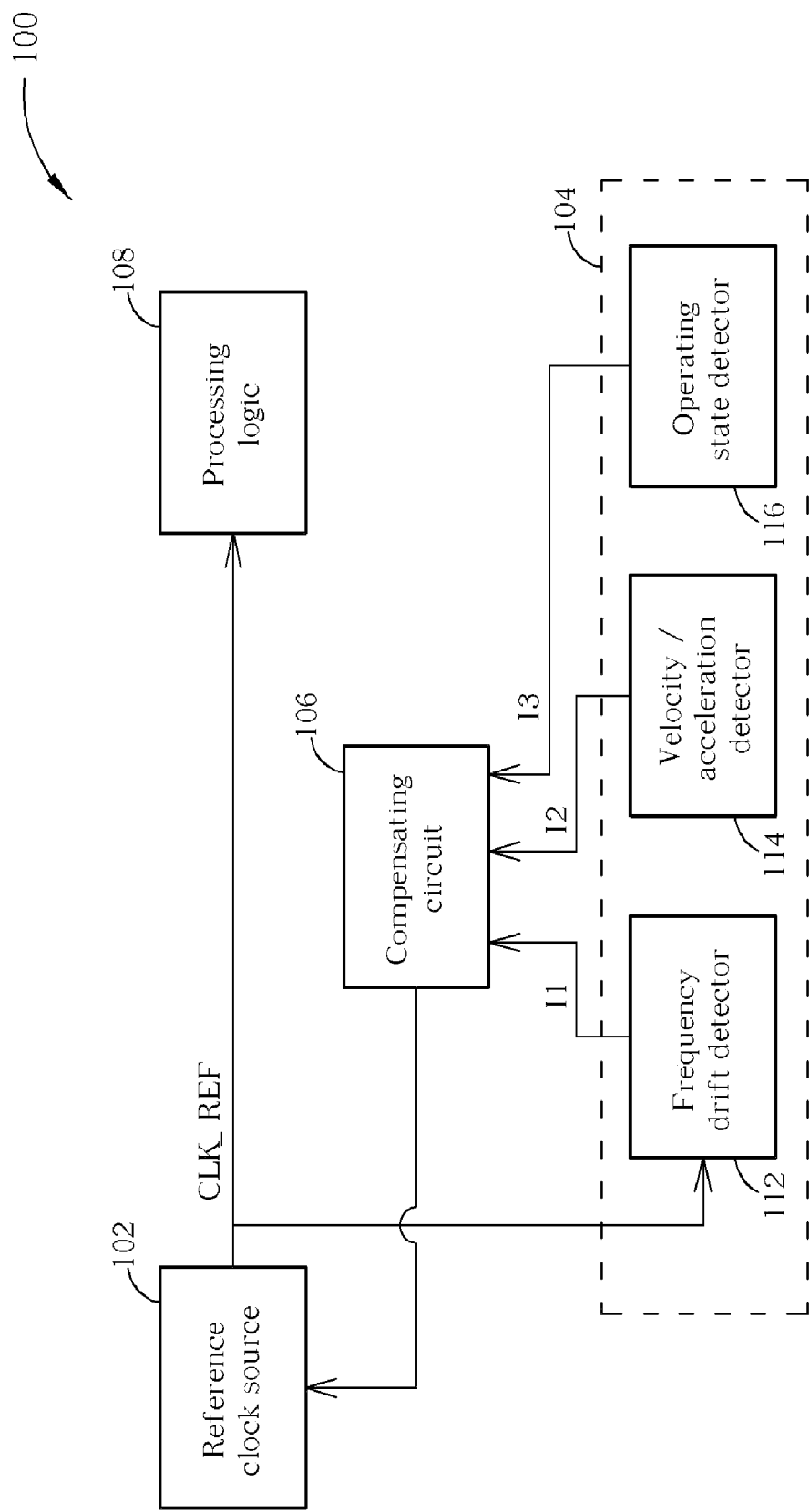
FIG. 1 is a block diagram illustrating a first exemplary embodiment of an electronic apparatus according to the present invention.

FIG. 1 is a block diagram illustrating a first exemplary embodiment of an electronic apparatus according to the present invention. In this embodiment, the electronic apparatus is a global navigation satellite system (GNSS) receiver 100 including a reference clock source 102, a monitoring circuit 104, a compensating circuit 106, and a processing logic 108. In one implementation, the monitoring circuit 104, the compensating circuit 106, and the processing logic 108 are all integrated in a chip, while the reference clock source 102 is externally coupled to the chip. However, this is for illustrative purposes only; that is, the GNSS receiver 100 of the present invention is not limited to this specific configuration. In this embodiment, the reference clock source 102 is for generating a reference clock CLK_REF used by the GNSS receiver 100 to achieve normal operation. For example, the reference clock source 102 could be implemented using a temperature compensated crystal oscillator (TCXO) that has a temperature compensation loop included therein to stabilize the oscillating frequency of the generated reference clock CLK_REF. As the TCXO is well known to those skilled in the pertinent art, further description is omitted here for brevity. It should be noted that using a TCXO to act as the desired reference clock source merely serves as an exemplary implementation, and is not meant to be taken as a limitation of the present invention.

The monitoring circuit 104 is implemented to monitor at least one non-temperature factor indicative of frequency drift occurrence of the reference clock CLK_REF and then generate a monitoring result. In this embodiment, the monitoring circuit 104 includes a frequency drift detector 112, a velocity/acceleration detector 114, and an operating state detector 116 used for detecting three non-temperature factors respectively. The frequency drift detector 112 monitors frequency of the reference clock CLK_REF directly, and generates a monitoring result I1 to the compensating circuit 106. For example, when the frequency drift of the reference clock CLK_REF is detected by the frequency drift detector 112, the compensating circuit 106 is notified by the monitoring result I1. The velocity/acceleration detector 114 monitors velocity or acceleration of the electronic apparatus (i.e., the GNSS receiver 100), and generates a monitoring result I2 to the compensating circuit 106. For example, when the electronic apparatus (i.e., the GNSS receiver 100) is not static and has motion (i.e., velocity), this implies that the electronic apparatus (i.e., the GNSS receiver 100) must have acceleration being positive or negative to thereby achieve the current velocity. Therefore, as the acceleration is one factor affecting the stability of the oscillating frequency of the reference clock CLK_REF generated from the reference clock source 102, the compensating circuit 106 is notified by the monitoring result I2 when the acceleration occurrence is detected by the velocity/acceleration detector 114. The operating state detector 116 monitors the operating state of the electronic apparatus (i.e., the GNSS receiver 100), and generates a monitoring result I3 to the compensating circuit 106. For example, the GNSS receiver 100 has two operating states, a normal mode and a power-saving mode. When the operating state of the GNSS receiver 100 is switched from one mode to the other mode, the oscillating frequency of the reference clock CLK_REF is shifted due to the change of the operating environment of the reference clock source 102, such as impedance change, supply voltage change, etc. Therefore, when the operating state change of the electronic apparatus (i.e., the GNSS receiver 100) is acknowledged or anticipated by the operating state detector 116, the compensating circuit 106 is notified by the monitoring result I3.

When at least one of the monitoring results I1, I2, I3 indicates that frequency drift of the reference clock CLK_REF occurs, the compensating circuit 106 is actuated to compensate the reference clock source 102 for stabilizing the oscillating frequency of the reference clock CLK_REF, i.e., reducing or eliminating the frequency drift of the reference clock CLK_REF. In this way, the processing logic 108, such as a micro control unit (MCU) or digital signal processor (DSP), can perform a designated operation according to the steady reference clock CLK_REF, thereby generating accurate output. For example, the processing logic 108 is implemented to do the correlation processing upon an input derived from the satellite signal received from the global navigation satellite system, such as GPS, Galileo, or GLONASS. With the help of the disclosed compensation mechanism, the performance of the GNSS receiver 100 is improved greatly because of the accurate reference clock CLK_REF.

Figure 2:
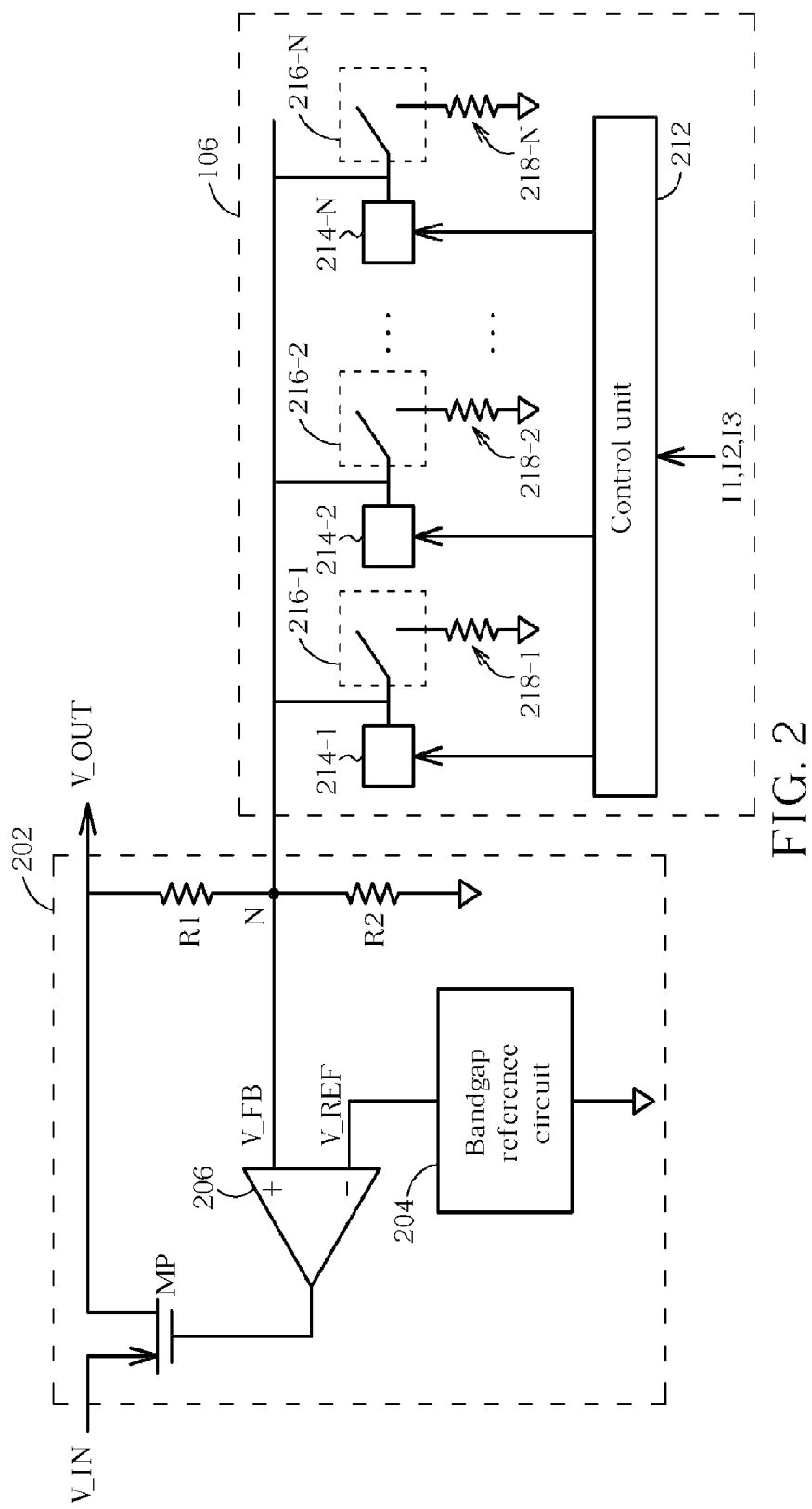
FIG. 2 is a diagram illustrating an exemplary embodiment of a compensating circuit shown in FIG. 1.

In this embodiment, the compensating circuit 106 is configured to adjust the supply voltage provided to the reference clock source 102. Please refer to FIG. 2. FIG. 2 is a diagram illustrating an exemplary embodiment of the compensating circuit 106 shown in FIG. 1. The GNSS receiver 100 has a low drop voltage regulator (LDO) 202 for providing the supply voltage V_OUT to the reference clock source 102 shown in FIG. 1 according to a voltage source V_IN. The LDO 202 includes a pass transistor MP, a voltage divider implemented using two resistors R1 and R2 to provide a feedback voltage V_FB, a bandgap reference circuit 204 used to provide a temperature-independent reference voltage V_REF, and a comparator 206 implemented using an operational amplifier to compare the feedback voltage V_FB with the reference voltage V_REF to control the pass transistor MP. As the operation of the low drop voltage regulator is well known to those skilled in the art, further description is omitted here for brevity.

Figure 3:
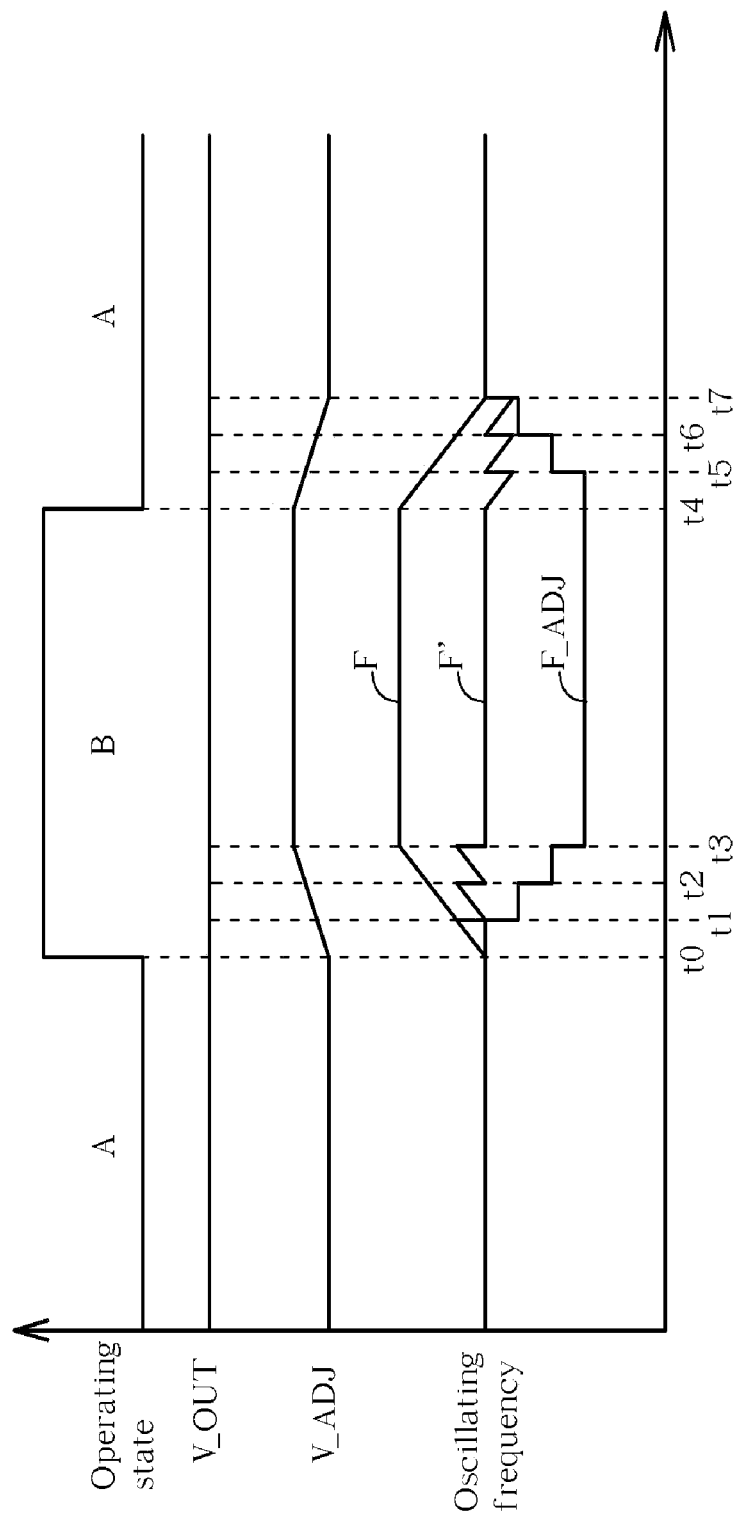
FIG. 3 is a diagram illustrating operation of compensating a reference clock by adjusting a supply voltage of a reference clock source.

As shown in FIG. 2, the exemplary compensating circuit 106 is implemented using a resistor bank coupled to feedback node N in the LDO 202. The compensating circuit 106 includes a control unit 212, a plurality of control registers 214-1-214-N, a plurality of switches 216-1-216-N, and a plurality of resistors 218-1-218-N. The control unit 212 receives the monitoring results I1, I2, I3 mentioned above, and then sets the control registers 214-1-214-N to control the on/off states of switches 216-1-216-N respectively when notified that the reference clock CLK_REF has frequency drift. In other words, the compensating circuit 106 equivalently acts as an adjustable resistor coupled to the resistor R2 in a parallel fashion. In this way, the feedback voltage V_FB can be adequately adjusted by the compensating circuit 106, and then the supply voltage V_OUT of the reference clock source 102 is modified accordingly. Suppose that the oscillating frequency of the reference clock CLK_REF is decreased when the supply voltage of the reference clock source (e.g., TCXO) 102 is increased. The operation of compensating the reference clock CLK_REF by adjusting the supply voltage of the reference clock source (e.g., TCXO) 102 is illustrated by an example shown in FIG. 3. The operating state of the electronic apparatus (e.g., the GNSS receiver 100) is switched from state A to state B at time t0 and switched from state B to state A at time t4. The V_OUT represents the original supply voltage with no compensation applied thereto. As one can see, when the operating state is switched from state A to state B at time t0, the original oscillating frequency of the reference clock CLK_REF has a significant frequency drift as indicated by the curve F; similarly, when the operating state is switched from state B to state A at time t4, the oscillating frequency of the reference clock CLK_REF also has a significant frequency drift as indicated by the curve F. To alleviate the frequency drift, the compensating circuit 106 shown in FIG. 2 is implemented to add compensation voltage V_ADJ to the original supply voltage V_OUT, thereby inducing frequency adjustment F_ADJ to reduce the frequency drift. As illustrated by the curve F' in FIG. 3, the resultant oscillating frequency is stabilized due to the compensation voltage V_ADJ added to the original supply voltage V_OUT. Each period t0-t3 or t4-t7 is needed for the reference clock CLK_REF to be stabilized after the operating state change. In this embodiment, each period is further divided into three compensation segments, and the different compensation voltage is applied in each compensation segment; however, this is for illustrative purposes only. For example, when each period is divided into more compensation segments, the curve F' during the periods t0-t3 and t4-t7 could be smoother, implying better performance of compensating the frequency drift of the reference clock CLK_REF. Briefly summarized, using the compensating circuit 106 to properly adjust the supply voltage of the reference clock source 102 can stabilize the reference clock CLK_REF when frequency drift occurrence is detected by the monitoring circuit 104 shown in FIG. 1.

Figure 4:
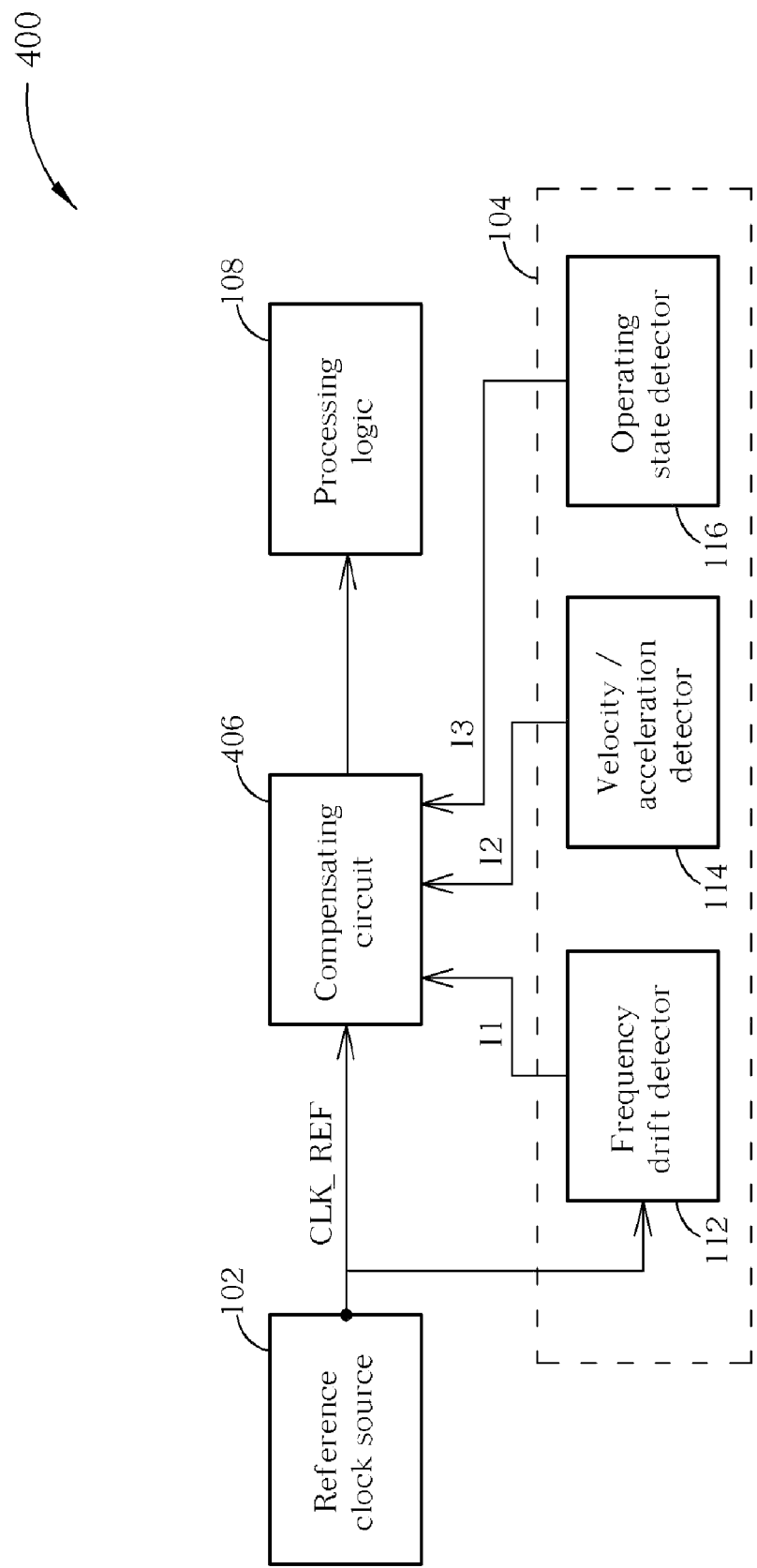
FIG. 4 is a block diagram illustrating a second exemplary embodiment of an electronic apparatus according to the present invention.
Figure 5:
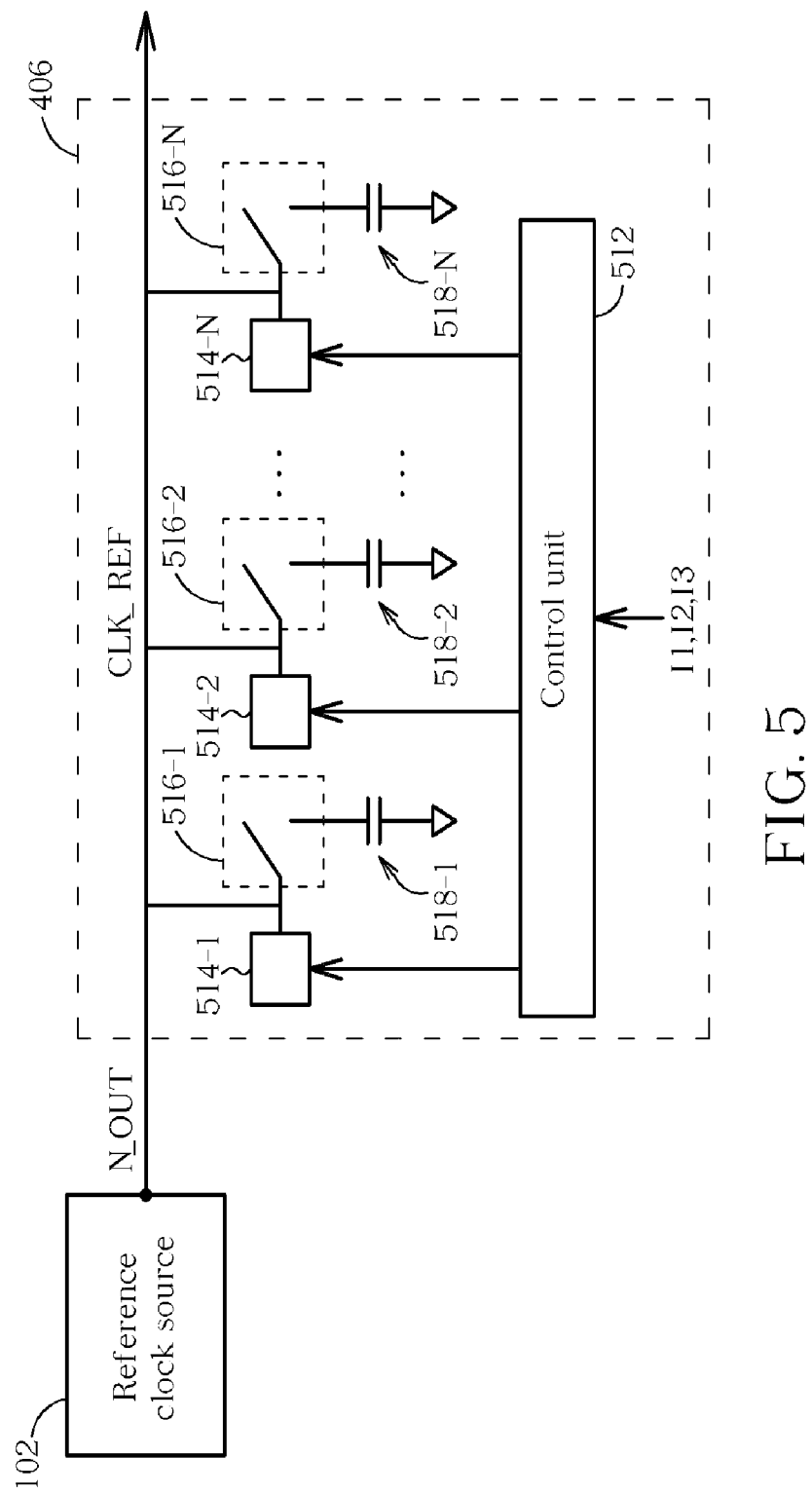
FIG. 5 is a diagram illustrating a first exemplary embodiment of a compensating circuit shown in FIG. 4.

FIG. 4 is a block diagram illustrating a second exemplary embodiment of an electronic apparatus according to the present invention. In this embodiment, the electronic apparatus is a global navigation satellite system (GNSS) receiver 400 including a reference clock source 102, a monitoring circuit 104, a compensating circuit 406, and a processing logic 108. In one implementation, the monitoring circuit 104, the compensating circuit 406, and the processing logic 108 are all integrated in a chip, and the reference clock source 102 is externally coupled to the chip. However, this is for illustrative purposes only; that is, the GNSS receiver 400 of the present invention is not limited to this specific configuration. The GNSS receiver 400 in FIG. 4 is similar to the GNSS receiver 100 in FIG. 1, and the major difference is that the compensating circuit 406 shown in FIG. 4 is coupled to an output port of the reference clock source 102 to adjust the oscillating frequency of the reference clock CLK_REF generated from the reference clock source 102 to the processing logic 108 of the GNSS receiver 400. In this embodiment, the exemplary compensating circuit 406 is configured to adjust load of the reference clock source 102. Please refer to FIG. 5. FIG. 5 is a diagram illustrating a first exemplary embodiment of the compensating circuit 406 shown in FIG. 4. The compensating circuit 406 is implemented using a capacitor bank coupled to the output node N_OUT of the reference clock source 102. The compensating circuit 406 includes a control unit 512, a plurality of control registers 514-1-514-N, a plurality of switches 516-1-516-N, and a plurality of capacitors 518-1-518-N. The control unit 512 receives the monitoring results I1, I2, I3 generated from the monitoring circuit 104, and then sets the control registers 514-1-514-N to control the on/off states of switches 516-1-516-N respectively when notified that the reference clock CLK_REF has frequency drift. In other words, the compensating circuit 406 equivalently acts as an adjustable load coupled to the output port N_OUT of the reference clock source 102. In this way, when the load value of the adjustable load is changed, the oscillating frequency of the reference clock CLK_REF is adjusted due to the change of the load coupled to the reference clock source 102. For example, the oscillating frequency of the reference clock CLK_REF is decreased when the load value of the compensating circuit 406 (i.e., the equivalent capacitance of the compensating circuit 406) is increased. Briefly summarized, using the compensating circuit 406 to properly adjust the load of the reference clock source 102 can stabilize the oscillating frequency of the reference clock CLK_REF when frequency drift occurrence is detected by the monitoring circuit 104 shown in FIG. 4.

Figure 6:
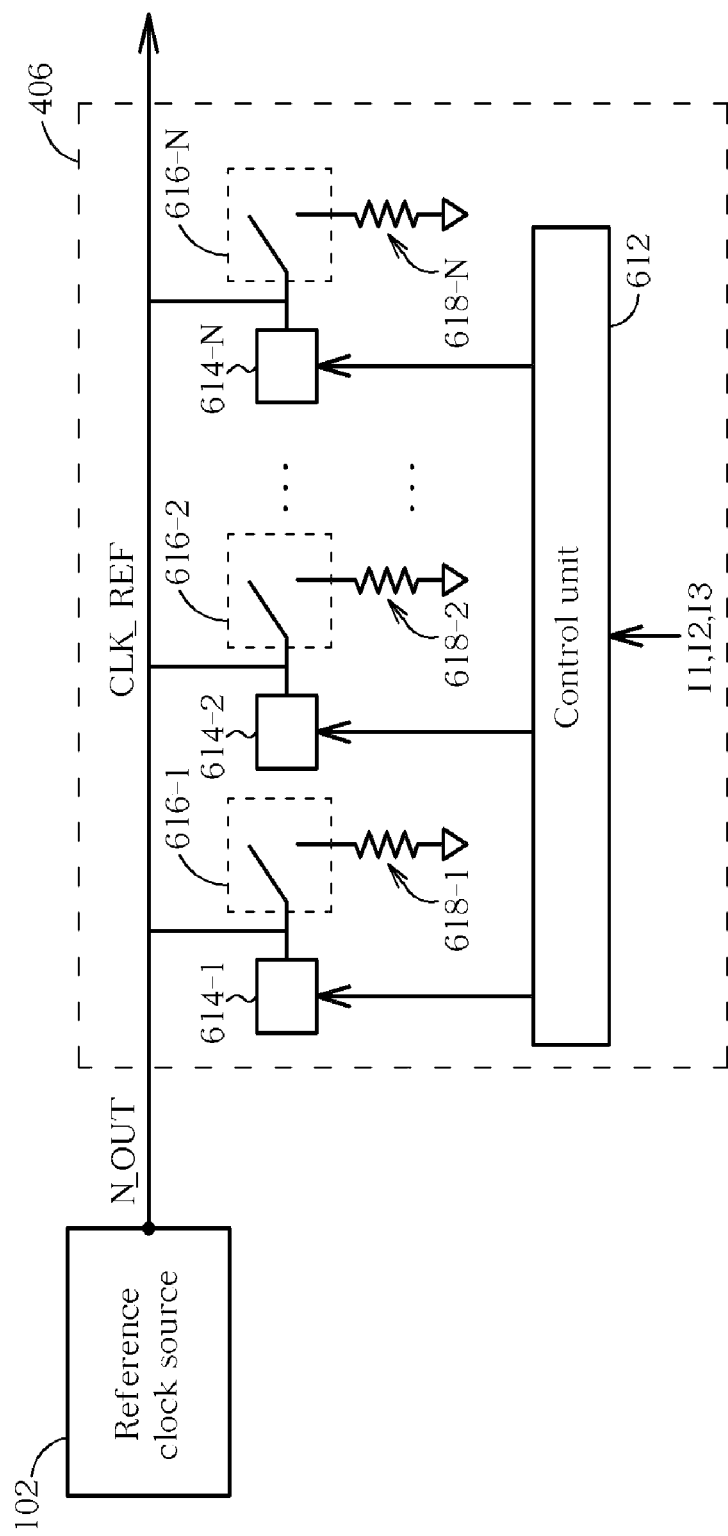
FIG. 6 is a diagram illustrating a second exemplary embodiment of the compensating circuit shown in FIG. 4.

FIG. 6 is a diagram illustrating a second exemplary embodiment of the compensating circuit 406 shown in FIG. 4. In this alternative design, the compensating circuit 406 is implemented using a resistor bank coupled to the output node N_OUT of the reference clock source 102. The compensating circuit 406 includes a control unit 612, a plurality of control registers 614-1-614-N, a plurality of switches 616-1-616-N, and a plurality of resistors 618-1-618-N. The control unit 612 receives the monitoring results I1, I2, I3 generated from the monitoring circuit 104, and then sets the control registers 614-1-614-N to control the on/off states of respective switches 616-1-616-N when notified that the reference clock CLK_REF has frequency drift. Similar to the capacitor bank shown in FIG. 5, the compensating circuit 406 in FIG. 6 also acts as an adjustable load coupled to the output port N_OUT of the reference clock source 102. In this way, when the load value of the adjustable load is changed, the oscillating frequency of the reference clock CLK_REF is adjusted due to the change of the load coupled to the reference clock source 102.

Figure 7:
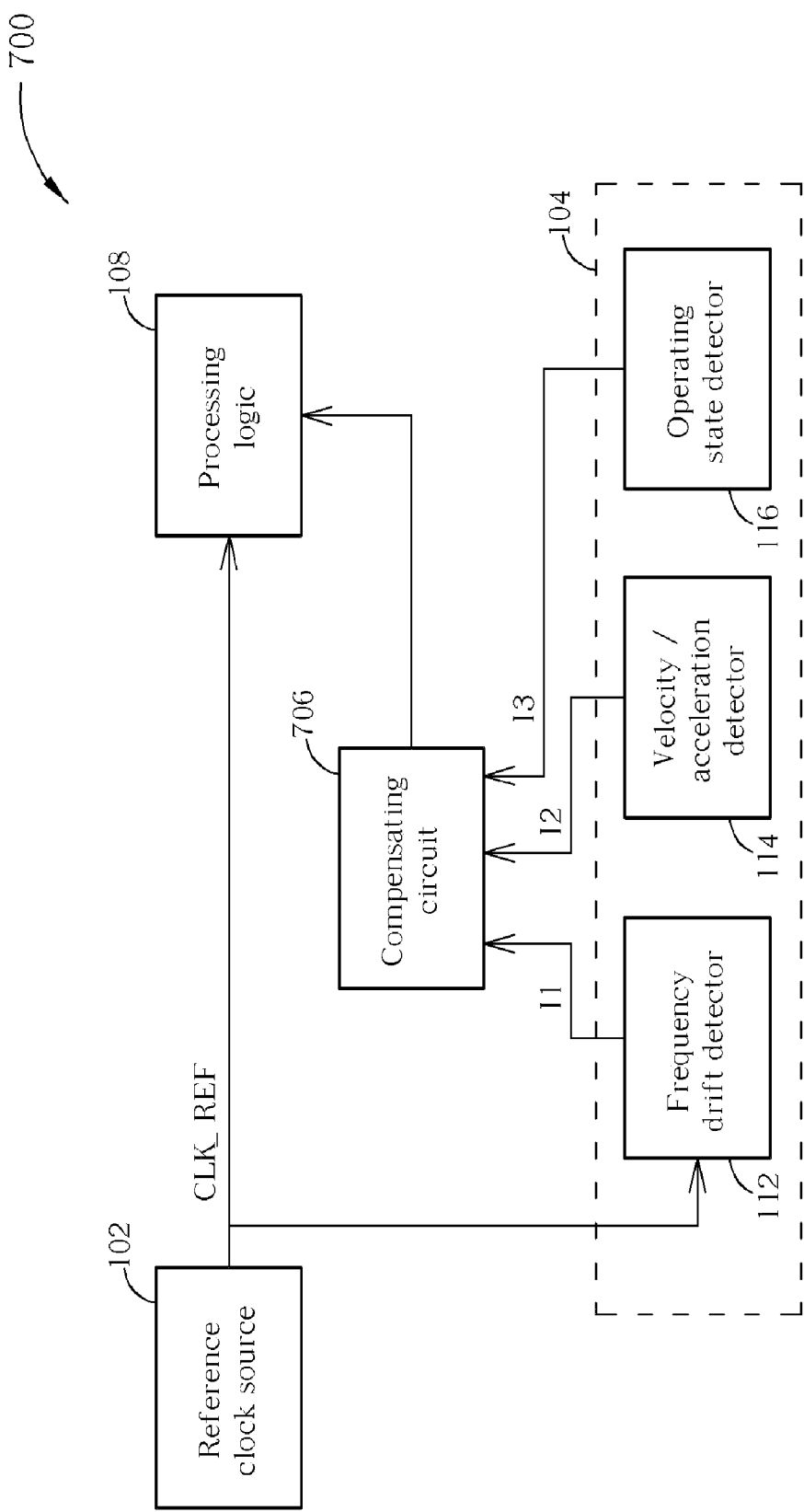
FIG. 7 is a block diagram illustrating a third exemplary embodiment of an electronic apparatus according to the present invention.

FIG. 7 is a block diagram illustrating a third exemplary embodiment of an electronic apparatus according to the present invention. In this embodiment, the electronic apparatus is a global navigation satellite system (GNSS) receiver 700 including a reference clock source 102, a monitoring circuit 104, a compensating circuit 706, and a processing logic 108. In one implementation, the monitoring circuit 104, the compensating circuit 706, and the processing logic 108 are all integrated in a chip, and the reference clock source 102 is externally coupled to the chip. However, this is for illustrative purposes only; that is, the GNSS receiver 700 of the present invention is not limited to this specific configuration. The GNSS receiver 700 in FIG. 7 is similar to the GNSS receiver 100 in FIG. 1, and the major difference is that the compensating circuit 706 shown in FIG. 7 is coupled to the processing logic 108 to compensate the designated operation performed by the processing logic 108.

Figure 8:
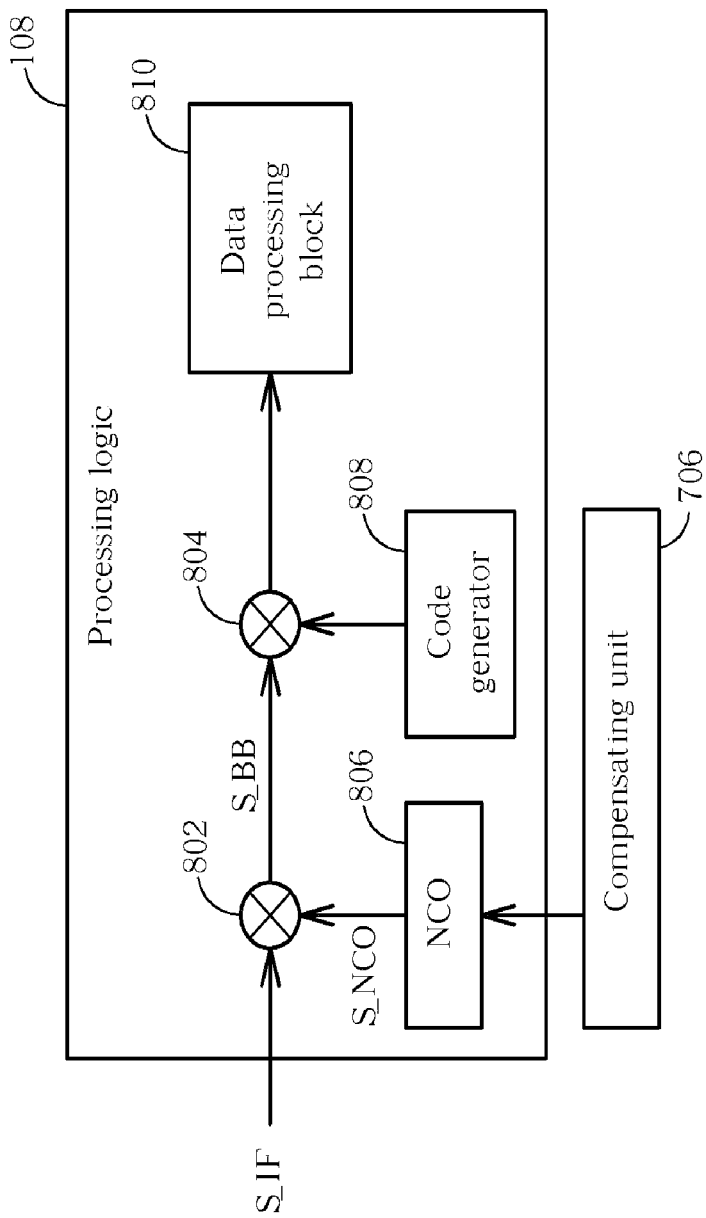
FIG. 8 is a diagram illustrating a first example of using a compensating circuit to compensate the designated operation performed by a processing logic shown in FIG. 7.

Please refer to FIG. 8. FIG. 8 is a diagram illustrating a first example of using the compensating circuit 706 to compensate the designated operation performed by the processing logic 108 shown in FIG. 7. In this example, the processing logic 108 includes, but is not limited to, a plurality of mixers 802, 804, a numerically controlled oscillator (NCO) 806, a code generator 808, and a data processing block 810. The mixer 802 serves as a down-converter, driven by an oscillating signal S_NCO produced by the NCO 806, for down-converting an incoming intermediate frequency (IF) signal S_IF into a baseband signal S_BB, wherein the IF signal S_IF is derived from an RF/IF conversion applied to a satellite signal (i.e., a radio frequency signal) received by the GNSS receiver 700. In general, the mixer 802 primarily serves two purposes. First, the IF frequency component remaining after RF/IF conversion is removed. Second, the satellite Doppler frequency shift resulting from satellite motion and/or user motion is removed. The baseband signal S_BB is mixed with an output generated from the code generator 808 by the mixer 804, and then the resultant signal is fed into the data processing block 810 for further signal processing. As the correlator architecture of the GNSS system is well known to those skilled in the pertinent art, further description directed to the hardware configuration shown in FIG. 8 is omitted here for brevity. In this exemplary embodiment, as the processing logic 108 is operated under the reference clock CLK_REF, the compensating circuit 706 is used to control the NCO 806 to properly adjust the frequency of the oscillating signal S_NCO when notified by the one of the monitoring results I1, I2, I3 that the frequency drift of the reference clock CLK_REF occurs. In this way, the signal inputted to the data processing block 810 is compensated and accurate even though the reference clock CLK_REF has frequency drift due to non-temperature effects.

Figure 9:
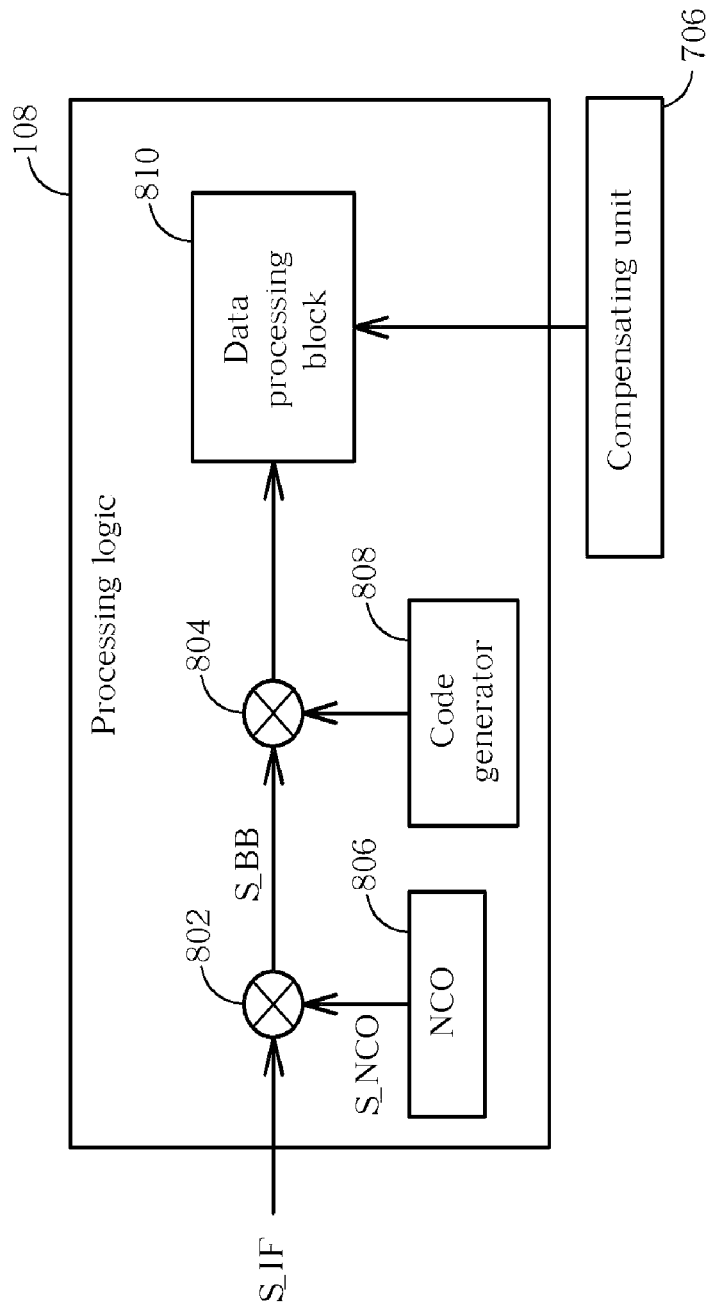
FIG. 9 is a diagram illustrating a second example of using a compensating circuit to compensate the designated operation performed by the processing logic shown in FIG. 7.

Please refer to FIG. 9. FIG. 9 is a diagram illustrating a second example of using the compensating circuit 706 to compensate the designated operation performed by the processing logic 108. The difference between the configurations shown in FIG. 8 and FIG. 9 is that the compensating circuit 706 in FIG. 9 is coupled to the data processing block 810 rather than the NCO 806. In this exemplary embodiment, the signal inputted to the data processing block 810 is no compensated; instead, the processing result of the data processing block 810 is compensated before being outputted. In other words, the compensating circuit 706 controls the data processing block 810 to adjust its processing result when notified by at least one of the monitoring results I1, I2, I3 that the reference clock CLK_REF has frequency drift. In this way, the inaccurate processing result due to the frequency drift of the reference clock CLK_REF is compensated, and a compensated and accurate processing result is outputted from the data processing block 810.

In above embodiments, the total number of detectors implemented in the monitoring circuit 104 is controllable depending upon design requirements. In other words, any implementations using at least one of the frequency drift detector, velocity/acceleration detector, and operating state detector fall in the scope of the present invention. Furthermore, the aforementioned compensating circuit could be implemented using hardware, software, or combination thereof.

Figure 10:
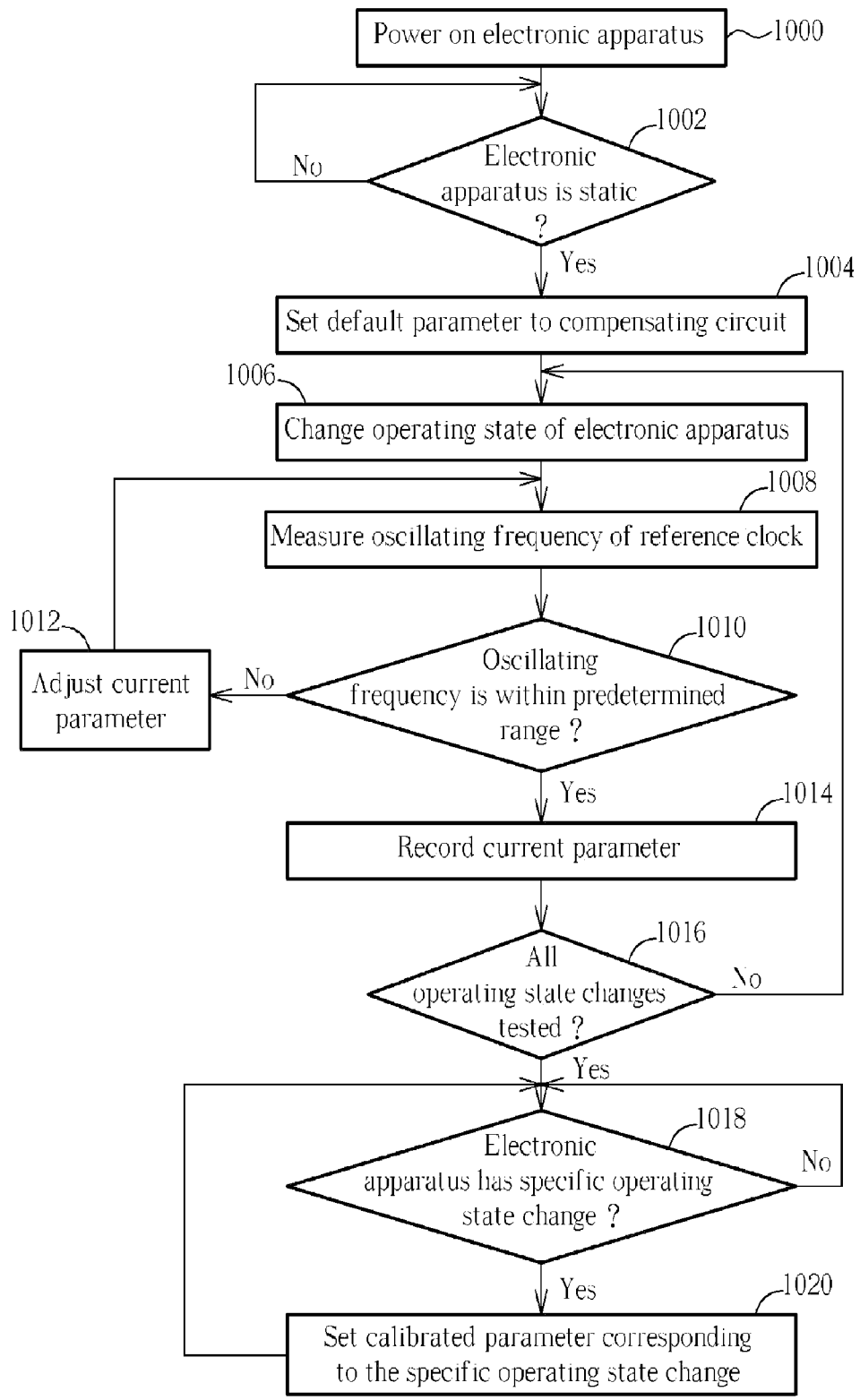
FIG. 10 is an exemplary flowchart illustrating compensation for frequency drift of a reference clock when an operating state is changed.

FIG. 10 is an exemplary flowchart illustrating compensation for frequency drift of a reference clock when an operating state is changed. Provided the result is substantially the same, the steps are not limited to be executed in the exact order shown in FIG. 10. The exemplary compensation flow includes the following steps.

Step 1000: Power on an electronic apparatus (e.g., a GNSS receiver).

Step 1002: Check if the electronic apparatus is static. If yes, go to step 1004; otherwise, proceed with step 1002.

Step 1004: Set a default parameter (for example, a default voltage adjustment setting or default load adjustment setting) to the compensating circuit.

Step 1006: Change an operating state of the electronic apparatus.

Step 1008: Measure an oscillating frequency of a reference clock generated from the reference clock source (e.g., a TCXO).

Step 1010: Check if the oscillating frequency is within a predetermined range. If yes, go to step 1014; otherwise, go to step 1012.

Step 1012: Adjust the parameter utilized by the compensating circuit, and then proceed with step 1008.

Step 1014: Record the current parameter for the current operating state change.

Step 1016: Are all of the possible operating state changes of the electronic apparatus tested? If yes, the electronic apparatus leaves the calibration procedure, and the flow goes to step 1018; otherwise, the flow proceeds with step 1006 to keep calibrating parameter of a non-tested operating state change.

Step 1018: Does the electronic apparatus have a specific operating state change? If yes, go to step 1020; otherwise, go to step 1018.

Step 1020: Set a calibrated parameter corresponding to the specific operating state change to the compensating circuit directly. Go to step 1018.

In above flow, the calibration of each parameter used by the compensating circuit when the working electronic apparatus (e.g., the GNSS receiver) has a corresponding operating state change is started only when the electronic apparatus is determined to be static. The motion status of the electronic apparatus can be determined by a dedicated sensor or user's manual input. When the calibration procedure is started, a default parameter is first loaded into the aforementioned compensating circuit. For example, if the compensating circuit 106 shown in FIG. 2 is employed, the control unit 212 sets the control registers 214-1-214-N according to the default parameter. Next, the electronic apparatus (e.g., the GNSS receiver) is controlled to have an operating state change, for example, from a normal mode into a power-saving mode. If the measured oscillating frequency of the reference clock generated from the reference clock source is within a predetermined range, meaning that the frequency drift is well-compensated due to the current parameter used by the compensating circuit, the current parameter is recorded for later use; however, if the measured oscillating frequency of the reference clock generated from the reference clock source is not within the predetermined range, meaning that the current parameter used by the compensating circuit fails to effectively reduce the frequency drift caused by the operating state change, the current parameter is adjusted and then the flow checks if the oscillating frequency of the reference clock is within the predetermined range. Adjusting the current parameter assigned to the compensating circuit is not stopped until the measured oscillating frequency of the reference clock generated from the reference clock source is within the predetermined range. In this way, a satisfactory parameter employed by the aforementioned compensating circuit is found for the current operating state change. In addition, the above parameter calibration is not stopped until all of the all of the possible operating state changes of the electronic apparatus have been tested. In other words, after the parameters of all possible operating state change of the electronic apparatus have been recorded, the calibrated parameters can be directly used for frequency compensation when needed. For example, when the working electronic apparatus has a specific operating state change, a calibrated parameter corresponding to the specific operating state change is directly set to the compensating circuit for compensating the frequency drift induced by the specific operating state change.

Figure 11:
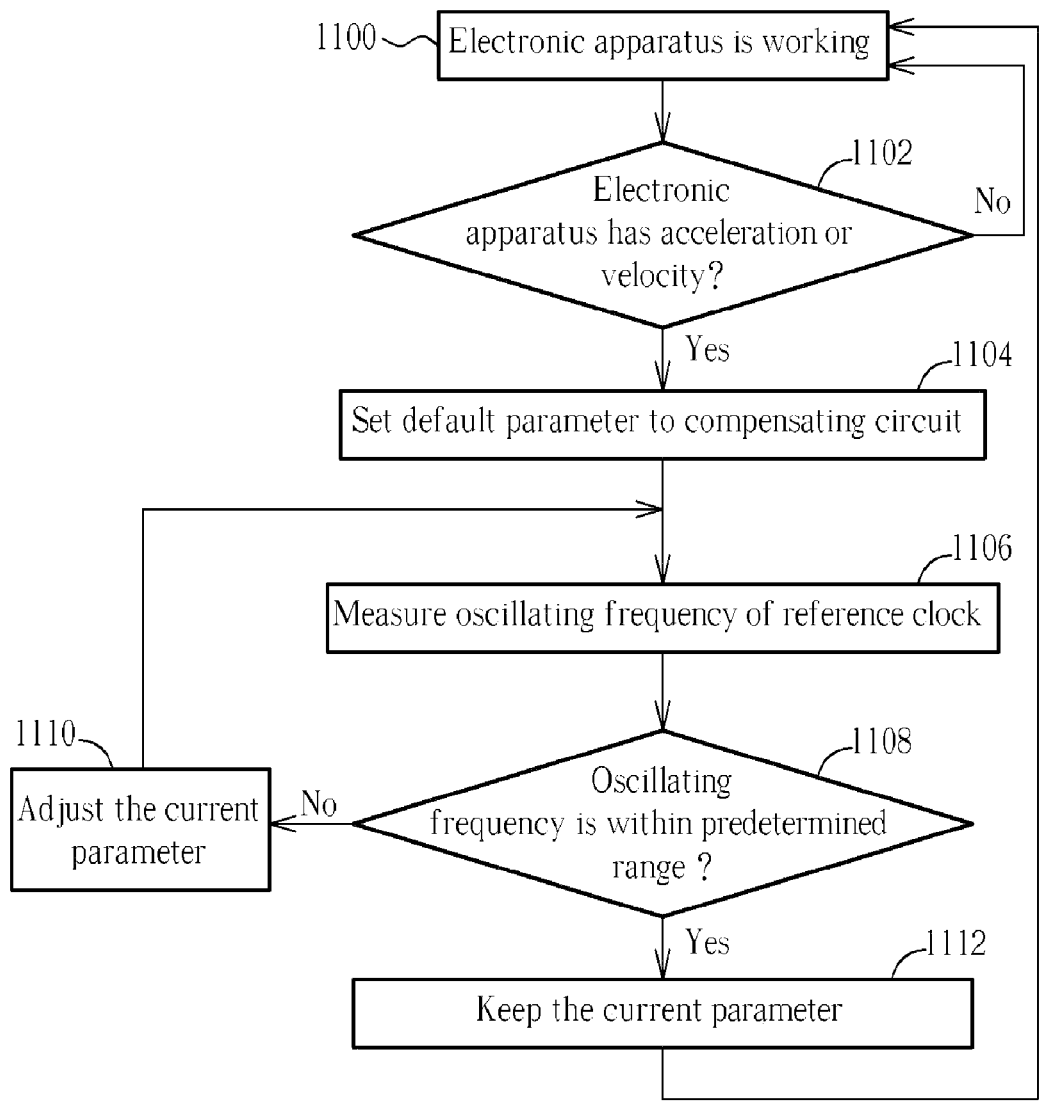
FIG. 11 is an exemplary flowchart illustrating compensation for frequency drift of a reference clock when acceleration or velocity is detected.

FIG. 11 is an exemplary flowchart illustrating compensation for frequency drift of a reference clock when acceleration or velocity is detected. Provided the result is substantially the same, the steps are not limited to be executed in the exact order shown in FIG. 11. The exemplary compensation flow includes the following steps.

Step 1100: An electronic apparatus (e.g., a GNSS receiver) is working.

Step 1102: Check if the electronic apparatus has motion (i.e., acceleration or velocity)? If yes, go to step 1104; otherwise, proceed with step 1100.

Step 1104: Set a default parameter to the compensating circuit.

Step 1106: Measure an oscillating frequency of a reference clock generated from a reference clock source.

Step 1108: Check if the oscillating frequency is within a predetermined range. If yes, go to step 1112; otherwise, go to step 1110.

Step 1110: Adjust the parameter utilized by the compensating circuit, and then proceed with step 1106.

Step 1112: Keep the current parameter. Go to step 1100.

The aforementioned velocity/acceleration detector is used to detect if the electronic apparatus (e.g., a GNSS receiver) has motion (i.e., velocity or acceleration). When the velocity/acceleration detector generates the monitoring result to inform the compensating circuit of the occurrence of acceleration, the compensating circuit first uses a default parameter. If the measured oscillating frequency of the reference clock generated from the reference clock source is within a predetermined range, meaning that the frequency drift is well-compensated due to the current parameter used by the compensating circuit, the current parameter is kept with no amendment, and the flow goes to step 1100. However, if the measured oscillating frequency of the reference clock generated from the reference clock source is not within the predetermined range, meaning that the current parameter used by the compensating circuit fails to effectively reduce the frequency drift caused by the acceleration of the electronic apparatus, the current parameter is adjusted and then the flow proceeds with step 1106 to check if the adjusted parameter meets the compensation requirement. Adjusting the current parameter set to the compensating circuit is not stopped until the measured oscillating frequency of the reference clock generated from the reference clock source is within the predetermined range. In this way, a satisfactory parameter employed by the aforementioned compensating circuit is found.

It should be noted that the flows shown in FIG. 10 and FIG. 11 are for illustrative purposes only, and are not meant to be limitations of the present invention. In other words, any implementation monitoring at least a non-temperature factor indicative of frequency drift occurrence of a reference clock generated from a reference clock source and then compensating the reference clock by adjusting the supply voltage/load of the reference clock source according to a monitoring result or compensating a designated operation performed by a processing circuit according to the monitoring result falls in the scope of the present invention.

Those skilled in the art will readily observe that numerous modifications and alterations of the device and method may be made while retaining the teachings of the invention.

What is claimed is:

1. An electronic apparatus, comprising:
   a reference clock source for generating a reference clock;
   a global navigation satellite system (GNSS) receiver for receiving satellites signals and the reference clock, comprising:
   a monitoring circuit, for monitoring whether the GNSS receiver is operating in a normal mode or a power-saving mode to generate a monitoring result; and
   a compensating circuit, coupled to the reference clock source and the monitoring circuit, for compensating the reference clock according to the monitoring result.

2. The electronic apparatus of claim 1, wherein the reference clock source is a temperature compensated oscillator.

3. The electronic apparatus of claim 1, wherein the compensating circuit comprises a variable resistor coupled to a voltage regulator utilized for providing a supply voltage to the reference clock source, and the variable resistor controls the voltage regulator to adjust the supply voltage according to the monitoring result.

4. The electronic apparatus of claim 1, wherein the compensating circuit comprises a variable load coupled to an output port of the reference clock source, and a load value of the variable load is adjusted according to the monitoring result.

5. A method of compensating a reference clock of an electronic apparatus, the electronic apparatus comprising a global navigation satellite system (GNSS) receiver, the method comprising:
   monitoring whether the GNSS receiver is operating in a normal mode or a power-saving mode to generate a monitoring result; and
   compensating the reference clock according to the monitoring result.

6. The method of claim 5, wherein the electronic apparatus further includes a processing logic coupled to the reference clock source for performing a designated operation according to the reference clock.

7. The method of claim 5, wherein compensating the reference clock according to the monitoring result comprises:
   adjusting a supply voltage provided to the reference clock source according to the monitoring result.

8. The method of claim 5, wherein compensating the reference clock according to the monitoring result comprises:
   adjusting a load coupled to an output port of the reference clock source according to the monitoring result.

* * * * *